(12) United States Patent  
Liu (10) Patent No.: US 9,087,868 B2
(45) Date of Patent: Jul. 21, 2015

(54) BIPOLAR JUNCTION TRANSISTORS WITH SELF-ALIGNED TERMINALS

(71) Applicant: International Business Machines Corporation, Armonk, NY (US)

(72) Inventor: Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/593,282

(22) Filed: Jan. 9, 2015

(65) Prior Publication Data

US 2015/0115399 A1 Apr. 30, 2015

Related U.S. Application Data

(62) Division of application No. 13/887,640, filed on May 6, 2013.

(51) Int. Cl.
*H01L 29/76* (2006.01)
*H01L 29/735* (2006.01)
*G06F 17/50* (2006.01)
*H01L 29/06* (2006.01)
*H01L 29/10* (2006.01)

(52) U.S. Cl.
CPC .......... *H01L 29/735* (2013.01); *G06F 17/5045* (2013.01); *H01L 29/0649* (2013.01); *H01L 29/1008* (2013.01)

(58) Field of Classification Search
USPC ......... 257/256, 565, 107, 110, 173, 370, 378, 257/557; 438/203, 309–312, 324, 341
See application file for complete search history.

(56) References Cited

U.S. PATENT DOCUMENTS

| 5,118,634 | A | 6/1992 | Neudeck et al. |
| 5,128,271 | A | 7/1992 | Bronner et al. |
| 5,196,356 | A | 3/1993 | Won et al. |
| 5,565,701 | A | 10/1996 | Zambrano |
| 5,591,656 | A | 1/1997 | Sawada |

(Continued)

FOREIGN PATENT DOCUMENTS

JP 08186122 7/1996

OTHER PUBLICATIONS

Dung Anh Le, Examiner, USPTO, Notice of Allowance issued in U.S. Appl. No. 13/887,640 dated Dec. 2, 2014.

(Continued)

*Primary Examiner* — Dung Le
(74) *Attorney, Agent, or Firm* — Wood, Herron & Evans, LLP; Anthony J. Canale (57) ABSTRACT

Device structures and design structures for a bipolar junction transistor. A semiconductor material layer is formed on a substrate and a mask layer is formed on the semiconductor material layer. The mask layer is patterned to form a plurality of openings to the semiconductor material layer. After the mask layer is formed and patterned, the semiconductor material layer is etched at respective locations of the openings to define a first trench, a second trench separated from the first trench by a first section of the semiconductor material layer defining a terminal of the bipolar junction transistor, and a third trench separated from the first trench by a second section of the semiconductor material layer defining an isolation pedestal. A trench isolation region is formed at a location in the substrate that is determined at least in part using the isolation pedestal as a positional reference.

19 Claims, 9 Drawing Sheets

(56) References Cited

U.S. PATENT DOCUMENTS 6,218,725 B1   4/2001   Jeon
6,864,560 B2 * 3/2005  Khater et al. ................. 257/565
7,265,018 B2   9/2007   Dunn et al.
7,846,805 B2   12/2010  Zhang et al.

2013/0299944 A1   11/2013   Lai et al.

OTHER PUBLICATIONS

Dung Anh Le, Examiner, USPTO, Ex parte Quayle action issued in U.S. Appl. No. 13/887,640 dated Jul. 28, 2014.

* cited by examiner

BIPOLAR JUNCTION TRANSISTORS WITH SELF-ALIGNED TERMINALS

BACKGROUND

The invention relates generally to semiconductor device fabrication and, in particular, to device structures for a bipolar junction transistor, fabrication methods for a bipolar junction transistor, and design structures for a bipolar junction transistor.

Bipolar junction transistors include three terminals, namely an emitter, a base, and a collector, that comprise three distinct semiconductor regions. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor includes two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Bipolar junction transistors may be utilized in demanding types of integrated circuits, especially integrated circuits designed for high-frequency applications and high-power applications. Bipolar complementary metal-oxide-semiconductor (BiCMOS) integrated circuits combine bipolar junction transistors and complementary metal-oxide-semiconductor (CMOS) field effect transistors to take advantage of the positive characteristics of both transistor types in the integrated circuit construction.

Device structures, fabrication methods, and design structures are needed that improve the performance of bipolar junction transistors.

BRIEF SUMMARY

In an embodiment of the invention, a method is provided for fabricating a bipolar junction transistor. The method may include forming a layer comprised of a semiconductor material and disposed on a substrate, forming a mask layer on the layer, and patterning the mask layer to form a plurality of openings to the layer. After the mask layer is formed and patterned, the method further includes etching through the layer at respective locations of the openings to define a first trench, a second trench separated from the first trench by a first section of the layer defining a terminal of the bipolar junction transistor, and a third trench separated from the first trench by a second section of the layer defining an isolation pedestal. A trench isolation region is formed at a location in the substrate that is determined at least in part using the isolation pedestal as a positional reference.

In an embodiment of the invention, a device structure is provided for a bipolar junction transistor formed using a substrate. The device structure may include an intrinsic base on the substrate, a terminal on the intrinsic base, and an isolation pedestal. The terminal is separated from the substrate by the intrinsic base. The terminal is comprised of a first section of a layer of a semiconductor material, and the isolation pedestal is comprised of a second section of the layer of the semiconductor material. The isolation pedestal is spaced laterally from the terminal by a trench in the layer of the semiconductor material.

In an embodiment of the invention, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure may include an intrinsic base on a substrate, a terminal on the intrinsic base, and an isolation pedestal. The terminal is separated from the substrate by the intrinsic base. The terminal is comprised of a first section of a layer of a semiconductor material, and the isolation pedestal is comprised of a second section of the layer of the semiconductor material. The isolation pedestal is spaced laterally from the terminal by a trench in the layer of the semiconductor material. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
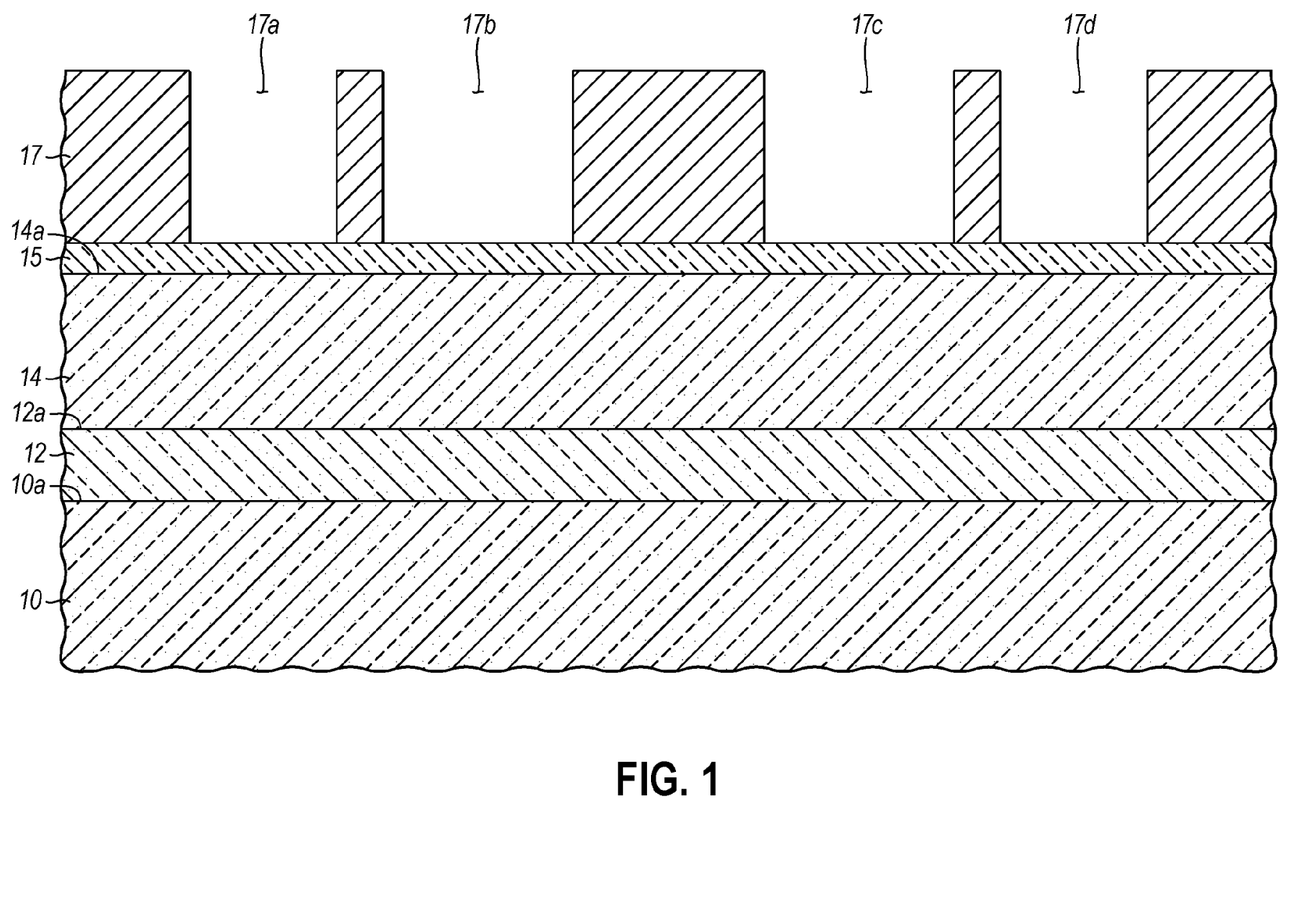
FIGS. 1-8 are cross-sectional views of a portion of a substrate at successive fabrication stages of a processing method for fabricating a device structure in accordance with an embodiment of the invention.
Figure 8:
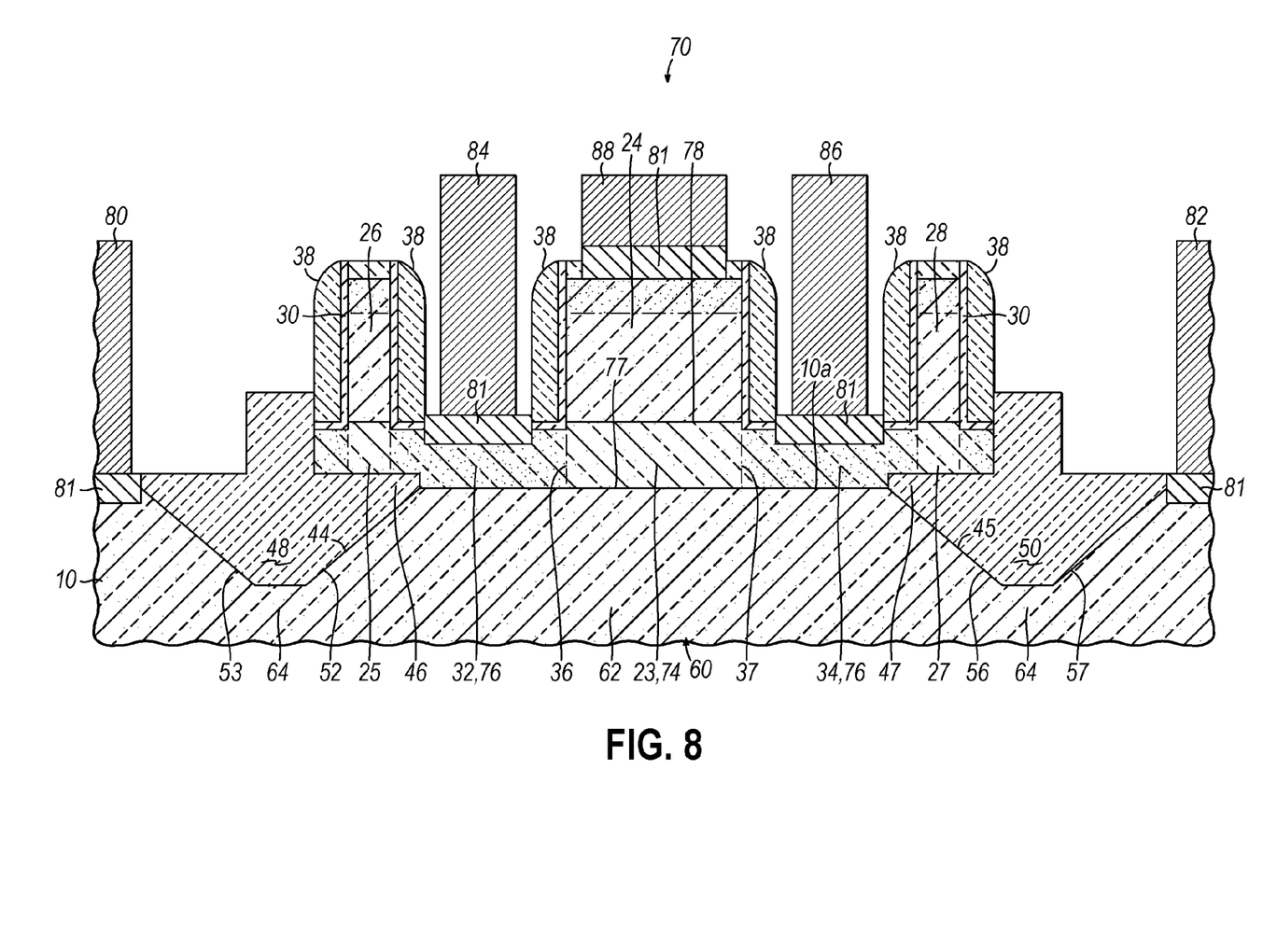

With reference to FIG. 1 and in accordance with an embodiment of the invention, a substrate 10 is used in the fabrication of a bipolar junction transistor 70 (FIG. 8). The substrate 10 may be any suitable bulk substrate comprising a semiconductor material that a person having ordinary skill in the art would recognize as suitable for forming an integrated circuit. For example, substrate 10 may be comprised of a wafer of a single crystal silicon-containing material, such as single crystal silicon with a (100) crystal lattice orientation. The semiconductor material comprising substrate 10 may be doped with an impurity to alter its electrical properties with an electrically-active dopant and may also include an optional epitaxial layer. In one embodiment, the substrate 10 may include an n-type impurity species from Group V of the Periodic Table (e.g., phosphorus (P), arsenic (As), or antimony (Sb)) effective to impart n-type conductivity. For example, a surface layer of the substrate may be implanted with the ions of the impurity species and subsequently annealed to activate the impurity species and alleviate implantation damage, or the optional epitaxial layer may be in situ doped during growth.

A base layer 12 is formed as a continuous additive layer on the top surface 10a of substrate 10. The base layer 12 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 12 may be uniform or the germanium content of base layer 12 may be graded and/or stepped across the thickness of base layer 12. If the germanium content is stepped, thicknesses of the base layer 12, such as respective thicknesses directly contacting the substrate 10 and adjacent to the top surface 12a, may not contain any germanium and may therefore be entirely comprised of silicon (Si). The base layer 12 may be doped with one or more impurity species, such as boron and optionally carbon to suppress the outdiffusion of the impurity species.

Base layer 12 may be formed using an epitaxial growth process, such as vapor phase epitaxy. Single crystal semiconductor material (e.g., single crystal silicon and/or single crystal SiGe) is epitaxially grown or deposited as base layer 12 on the exposed top surface 10a of substrate 10, which may be comprised of single-crystal semiconductor material that serves as a crystalline template during growth.

A layer 14 is formed on the top surface 12a of base layer 12 and a cap layer 15 of a dielectric material, such as silicon nitride ($Si_3N_4$), is formed on a top surface 14a of layer 14. Layer 14 is comprised of a semiconductor material, such as polysilicon deposited by CVD or LPCVD. Layer 14 may be undoped over a surface layer near the top surface 14a to provide an intrinsic-layer and heavily doped over a thickness between the surface layer and the top surface 12a. The heavily-doped portion of layer 14 may contain a concentration of a dopant, such as an impurities species from Group V of the Periodic Table (e.g., phosphorus (P), arsenic (As), or antimony (Sb)), to impart n-type conductivity. Polysilicon that is heavily doped exhibits a reduced resistivity compared with intrinsic polysilicon. The impurity species may be introduced by in situ doping that adds a dopant gas, such as phosphine or arsine, to the CVD reactant gases.

A mask layer 17 is applied on the top surface of the cap layer 15 and lithographically patterned with photolithography process to define openings 17a-d coinciding with the intended locations of trenches to be formed in layer 14. To that end, the mask layer 17 may comprise a photoresist that is applied as a layer by a spin coating process, pre-baked, exposed to a radiation projected through a photomask, baked after exposure, and developed with a chemical developer to form an etch mask that includes the openings.

Figure 2:
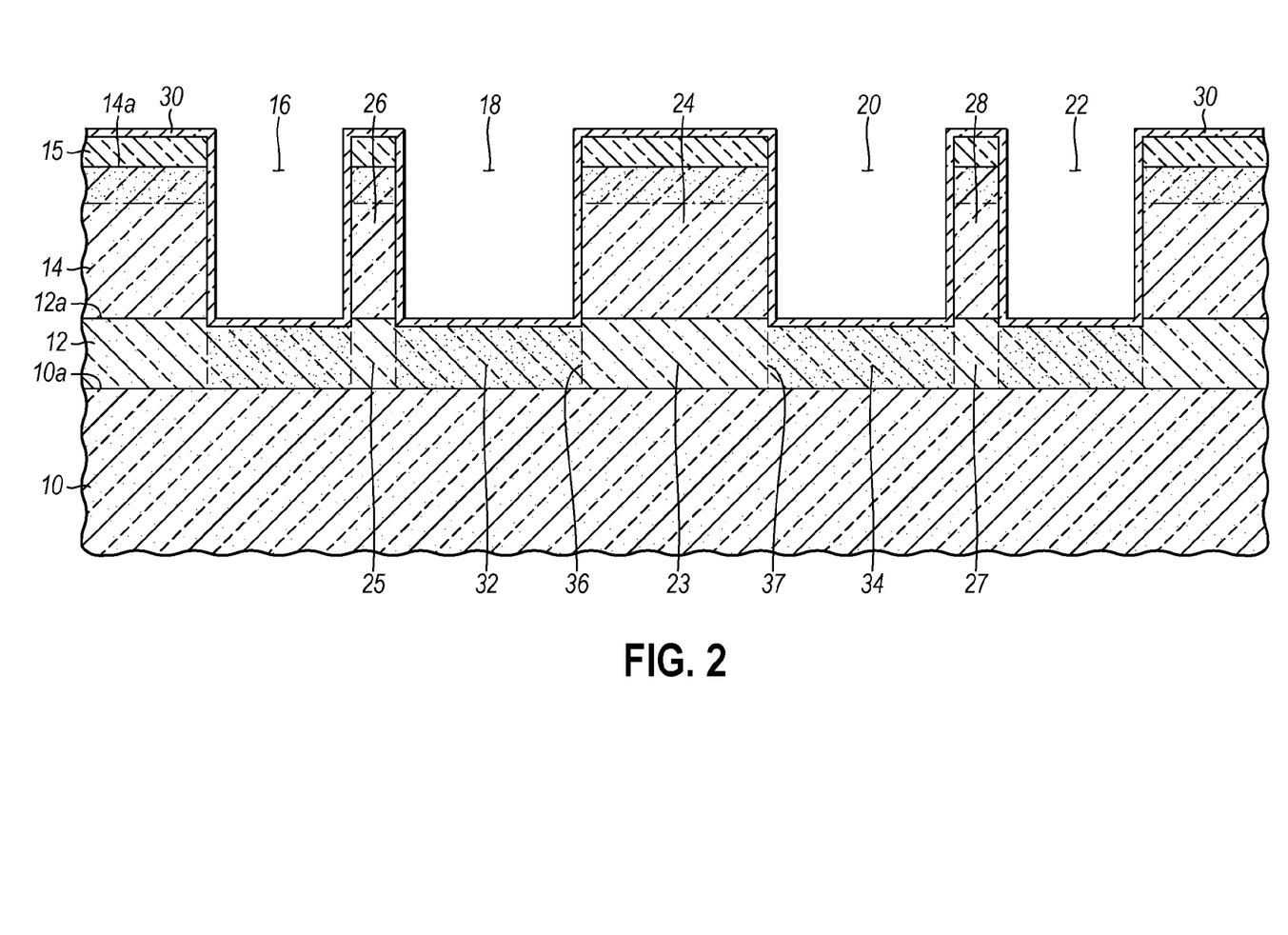

With reference to FIG. 2 in which like reference numerals refer to like features in FIG. 1 and at a subsequent fabrication stage of the processing method, trenches 16, 18, 20, 22 are formed that extend through the cap layer 15 and layer 14 to the top surface 12a of base layer 12. Trench 16 may be connected with trench 22 and trench 18 may be connected with trench 20 such that trenches 18, 20 are surrounded by trenches 16, 22. In one embodiment, trenches 16, 18, 20, 22 may have a width of 0.4 µm, and trenches 16, 22 may have a width of 0.3 µm.

An emitter 24, which has the form of a pedestal, is defined between the trenches 20, 22 from a section of the semiconductor material of layer 14. Sidewalls of emitter 24 are coextensive with the sidewalls of trenches 20, 22. The emitter 24 has a width defined as a distance between trenches 18, 20 and may have a width of 0.4 µm.

An isolation pedestal 26 is defined between trench 16 and trench 18, and an isolation pedestal 28 is defined between trench 20 and trench 22. The isolation pedestals 26, 28 comprise respective sections of the semiconductor material of layer 14. The isolation pedestals 26, 28 may be narrower in width than the emitter 24, and the isolation pedestals 26, 28 may be symmetrically positioned about the emitter 24 such that each is equidistant from the nearest sidewall of the emitter 24. Isolation pedestal 26 has a width given by the distance between trenches 16, 18, isolation pedestal 26 has a width given by the distance between trenches 20, 20, and the isolation pedestals 26, 28 may have a width of 0.1 µm. The isolation pedestals 26, 28 establish respective positional references for subsequent events in the process flow, such as the formation of trenches as described herein.

The trenches 16, 18, 20, 22, the emitter 24, and the isolation pedestals 26, 28 may be formed using mask layer 17 (FIG. 1) and an etching process. The pattern of openings in the mask layer 17 is transferred by the etching process from the mask layer to the layers 14, 15 and to a shallow depth into base layer 12 to define the trenches 16, 18, 20, 22. The etching process may comprise a wet etching process or a dry etching process, such as reactive-ion etching (RIE) that produces vertical sidewalls. The etching process, which may be conducted in a single etching step or multiple steps, relies on one or more etch chemistries and may comprise a timed etch. The mask layer 17 is removed after forming the trenches 16, 18, 20, 22. If comprised of a photoresist, the mask layer 17 may then be removed by ashing or solvent stripping, followed by a conventional cleaning process.

Before the mask layer 17 is patterned, the substrate 10 may be rotationally oriented in the lithography tool used in the photolithography process using a feature on the substrate, such as a notch at a peripheral edge, as an angular reference. Alignment marks on the substrate 10 and photomask may also be aligned in the photolithography tool to assist in rotationally orienting the substrate 10. The openings subsequently formed in the patterned mask layer are aligned with a crystallographic plane or orientation of the crystalline semiconductor material of substrate 10. For example, the openings may be oriented parallel to the [100] directions of a single crystal silicon substrate. The preferential alignment is transferred by the etching process from the openings in the mask layer 17 to the portion of the trenches 16, 18, 20, 22. In particular, the trenches 16, 18, 20, 22 are each aligned with a crystallographic plane or orientation of the crystalline semiconductor material of substrate 10.

A dielectric layer 30 is formed on the top surface 12a of base layer 12 exposed at the base and on the sidewalls of the trenches 16, 18, 20, 22 and on the top surface of cap layer 15 in field regions. The dielectric layer 30 may be comprised of an electrical insulator with a dielectric constant (e.g., a permittivity) characteristic of a dielectric material. In one embodiment, the dielectric layer 30 may be comprised of a high temperature oxide (HTO) deposited using rapid thermal process (RTP) at temperatures of 500° C. or higher. Alternatively, the dielectric layer 30 may be comprised of oxide formed by a different deposition process, thermal oxidation of silicon (e.g., oxidation at high pressure with steam (HIPDX)), or a combination of these processes. If thermal oxidation is involved in the formation of the dielectric layer 30, then base layer 12 will be slightly thinned at the bases of the trenches 16, 18, 20, 22.

Doped regions 32, 34 are formed in sections of the base layer 12 at the respective bases of the trenches 16, 18, 20, 22. The doped regions 32, 34 may be formed by introducing an impurity species to supply an electrically-active dopant. In one embodiment, the doped regions 32, 34 may be formed by implanting ions of an n-type impurity species selected from Group III of the Periodic Table (e.g., boron) effective to impart p-type conductivity. An anneal may be used to activate the impurity species and alleviate implantation damage. The ion implantation forms additional doped regions at shallow depths in field regions near the top surface of layer 14 and in an upper section of emitter 24.

Emitter 24 and the isolation pedestals 26, 28 operate as an implantation mask for sections 23, 25, 27 of base layer 12. Section 23 is coextensive with the doped regions 32, 34 along interfaces 36, 37, which are aligned vertically with the sidewalls of emitter 24. The interfaces 36, 37 may lack the abruptness as shown in the representative embodiment because of, for example, lateral straggle during implantation. Section 23 of the base layer 12 subsequently forms an intrinsic base of the bipolar junction transistor and portions of the doped regions 32, 34 form an extrinsic base of the bipolar junction transistor. Although the relative thicknesses may differ, the intrinsic base defined by section 23 of base layer 12 has nominally the same dimensions (i.e., width and length) as the emitter 24. For example, section 23 (which defines the intrinsic base in the device structure) and the emitter 24 may have nominally equal widths, $w_3$. The sections 25, 27 of base layer 12 are likewise shielded during the implantation.

Figure 3:
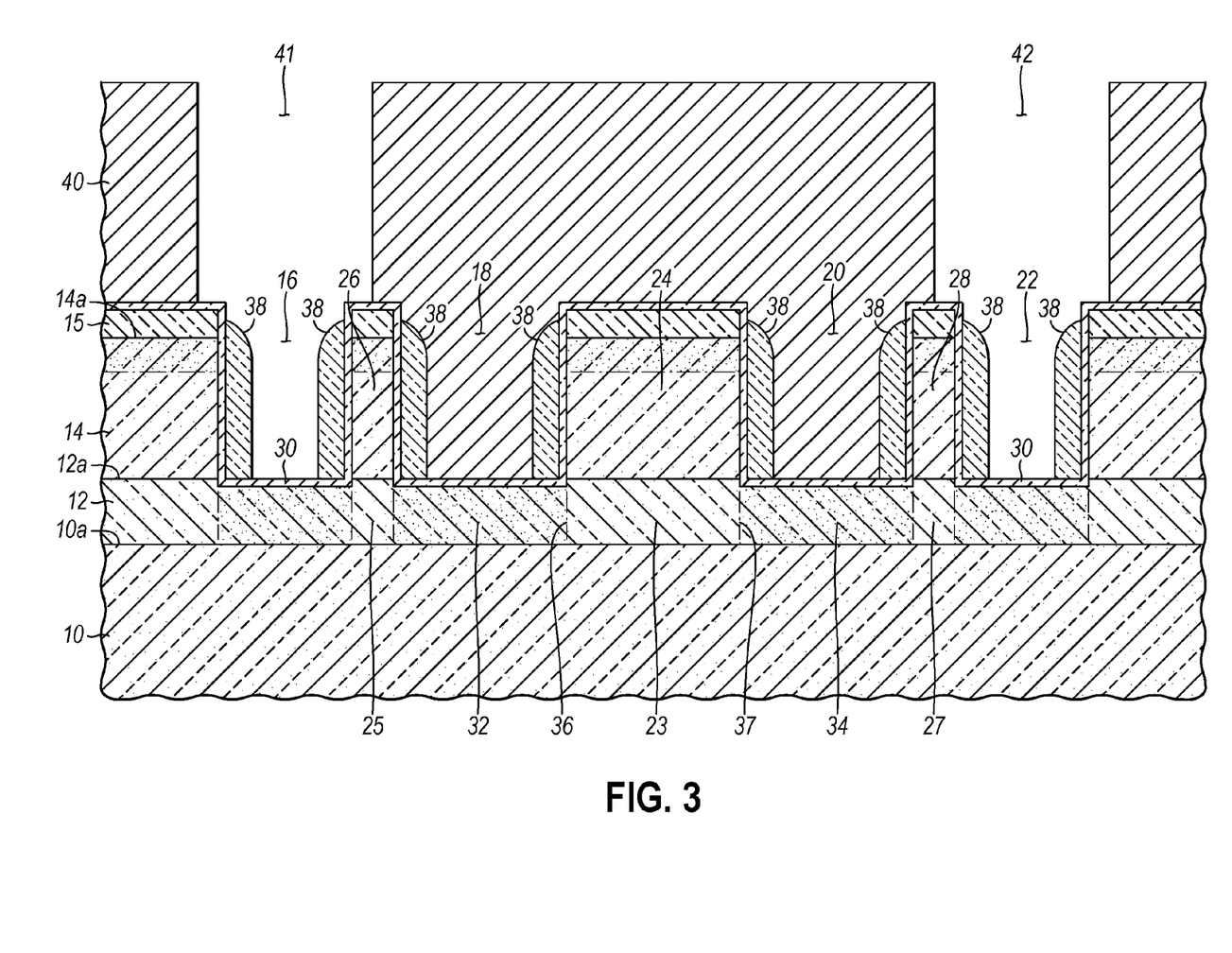

With reference to FIG. 3 in which like reference numerals refer to like features in FIG. 2 and at a subsequent fabrication stage of the processing method, dielectric spacers 38 are formed on the sidewalls of trenches 16, 18, 20, 22. The dielectric spacers 38 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces. The dielectric spacers 38 respectively function to narrow the width of the trenches 16, 18, 20, 22 and to cover and protect the sidewalls of base layer 12 that border the trenches 16, 18, 20, 22.

After the dielectric spacers 38 are formed, a mask layer 40 is applied and patterned with photolithography process to define openings 41, 42 coinciding with the intended locations of trenches in base layer 12 and substrate 10. To that end, the mask layer 40 may comprise a photoresist is applied as a layer by a spin coating process, pre-baked, exposed to a radiation projected through a photomask, baked after exposure, and developed with a chemical developer to form an etch mask that includes the openings 41, 42. Sections of dielectric layer 30 are removed from the top surface 12a of base layer 12 inside the narrowed trenches 16, 22 using an etching process. An oxide etch comprising buffered hydrofluoric acid or diluted hydrofluoric acid may be employed if the dielectric layer 30 is comprised of an oxide of silicon. Sections of dielectric layer 30 within trenches 18, 20 are masked by the mask layer 40 during the etching process. The mask layer 40 is removed after performing the etching process. If comprised of a photoresist, the mask layer may then be removed by ashing or solvent stripping, followed by a conventional cleaning process.

The isolation pedestals 26, 28 serve as positional references for the extension of the trenches 16, 22 through base layer 12 and into the substrate 10 and, thereby, maintain the self-alignment between the base layer 12, the emitter 24, and a portion of the substrate 10 that contains the collector 62 (FIG. 8). The presence of the isolation pedestals 26, 28 reduces the sensitivity to overlay misalignment of the openings 41, 42 in the mask layer 40. Opening 41 overlaps with the isolation pedestal 26 and opening 42 overlaps with the isolation pedestal 28. The openings 41, 42 can be shifted by a distance equal to the width of the isolation pedestals 26, 28 and spacers 38 on the isolation pedestals 26, 28, and still permit the dielectric layer 30 to be removed from within trenches 16, 22 without removing the dielectric layer 30 to be removed from within trenches 18, 20.

Figure 4:
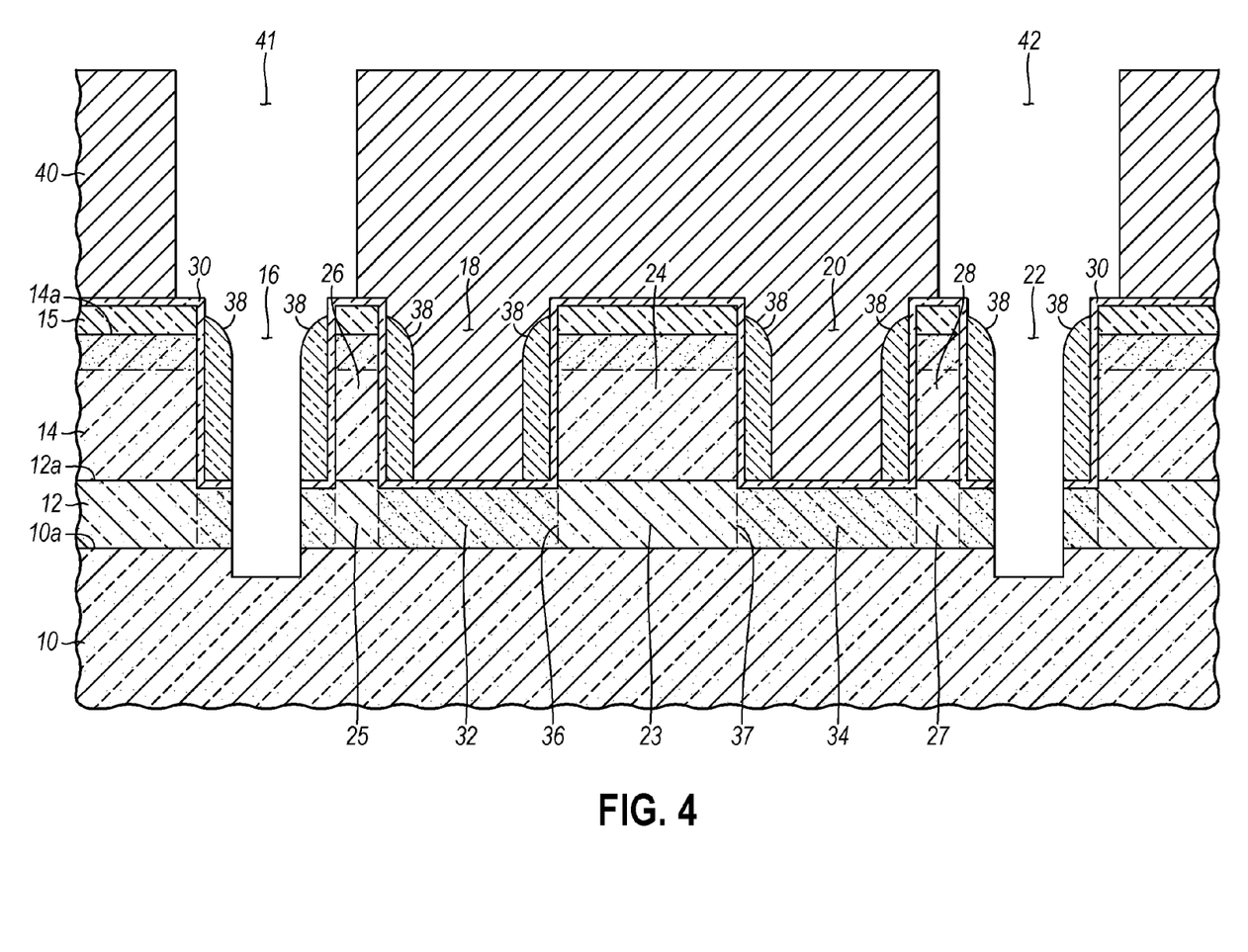

With reference to FIG. 4 in which like reference numerals refer to like features in FIG. 3 and at a subsequent fabrication stage of the processing method, the narrowed trenches 16, 22 are then extended vertically through the base layer 12 and to a depth into the underlying substrate 10. The vertical extension of the trenches 16, 22 may be provided by an etch process with an etch chemistry that removes the semiconductor material of base layer 12 selective to the material of dielectric layer 30 and the material of spacers 38. The etching process may comprise a wet etching process or a dry etching process, such as reactive-ion etching (RIE) that produces vertical sidewalls. In addition to narrowing the trenches, the spacers 38 shift the location of the vertical extension of trenches 16, 22 laterally relative to the locations of the respective isolation pedestals 26, 28.

Figure 5:
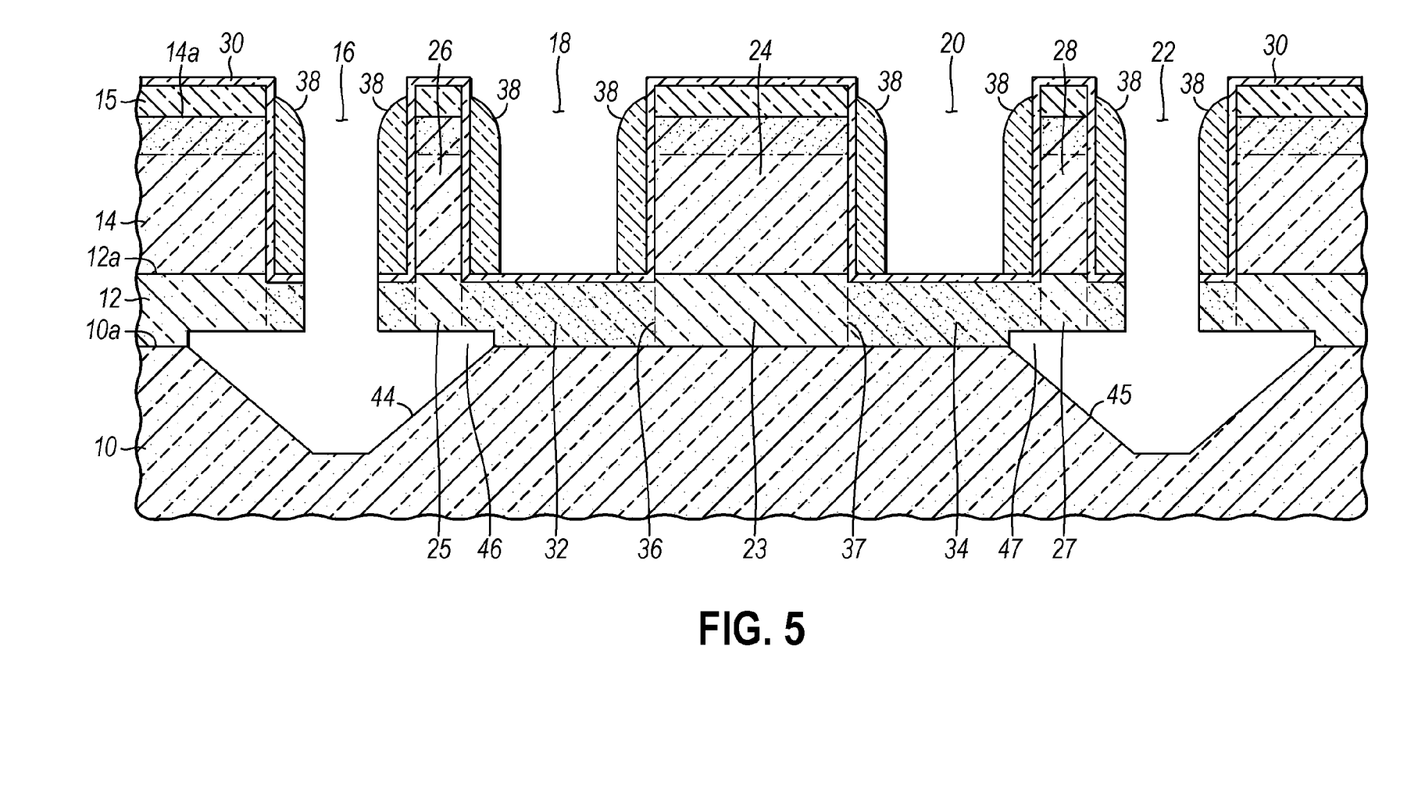

With reference to FIG. 5 in which like reference numerals refer to like features in FIG. 4 and at a subsequent fabrication stage of the processing method, trenches 16, 22 are modified to laterally recess the sidewalls 44, 45 into the substrate 10 relative to the original verticality of these sidewalls 44, 45 (FIG. 4). The lateral recession of the sidewalls 44, 45 forms a lateral extension 46 of trench 16 that undercuts the base layer 12 and a lateral extension 47 of trench 22 that also undercuts the base layer 12. The undercutting reduces the area of direct contact between the substrate 10 and base layer 12. The sidewall 44 of trench 16 and the sidewall 45 of trench 22 in substrate 10 are sloped or inclined at an angle relative to the top surface 10a. The lateral extension 46 is partially bounded by the sidewall 44 in substrate 10 and partially bounded by the bottom surface of the base layer 12. The lateral extension 47 is partially bounded by the sidewall 45 in the substrate 10 and partially bounded by the bottom surface of the base layer 12.

In a representative embodiment, the semiconductor material of the substrate 10 may be etched by a wet chemical etching process that removes the semiconductor material of the substrate 10 selective to the material of dielectric layer 30 and the material of spacers 38. In the representative embodiment, the selective etching process also removes the semiconductor material of the substrate 10 at a significantly higher rate than the semiconductor material comprising the base layer 12. A thin portion of the base layer 12 having a composition similar to the composition of the substrate 10 and bordering the lateral extensions 46, 47 may be removed by the etching process.

The profile of the lateral extensions 46, 47 of trenches 16, 22 in substrate 10 may be adjusted to have a specific shape, undercutting angle, undercut distance (i.e., bias), etc. by selecting factors such as the chemistry, duration, etc. of the etching process, and the crystal direction in the substrate 10 normal to the etch front. In an embodiment, the sidewalls 44, 45 of trenches 16, 22 may be recessed in the substrate 10 using an orientation-dependent etching process, called an anisotropic etching process herein, that has different etch rates for different crystallographic directions (as specified, for example, by Miller indices) in a semiconductor material. In one embodiment and if the substrate 10 is comprised of silicon, the anisotropic etching process may be a wet chemical etching process that uses an etchant comprising tetramethylammonium hydroxide (TMAH), ammonium hydroxide ($NH_4OH$), ethylenediamine pyrocatechol (EDP), or potassium hydroxide (KOH). The etching of silicon using these etchants is relatively slow for (111) crystal planes in comparison with other less-dense crystal planes, such as (100) crystal planes or (110) crystal planes, for which silicon etches more rapidly.

To provide the orientation, before the mask layer 40 (FIG. 3) is patterned, the substrate 10 may be rotationally oriented in the lithography tool used to pattern the mask layer in the photolithography process using a feature on the substrate, such as a notch or flat at a peripheral edge, as an angular reference. The relative rotational alignment of the substrate 10 and photomask in the photolithography tool causes the openings 41, 42 in the mask layer 40 to be oriented such that, before lateral extensions 46, 47 are formed, a crystal direction of the semiconductor material of substrate 10 that is normal to the respective sidewalls 44, 45 of the trenches 16, 22.

Figure 6:
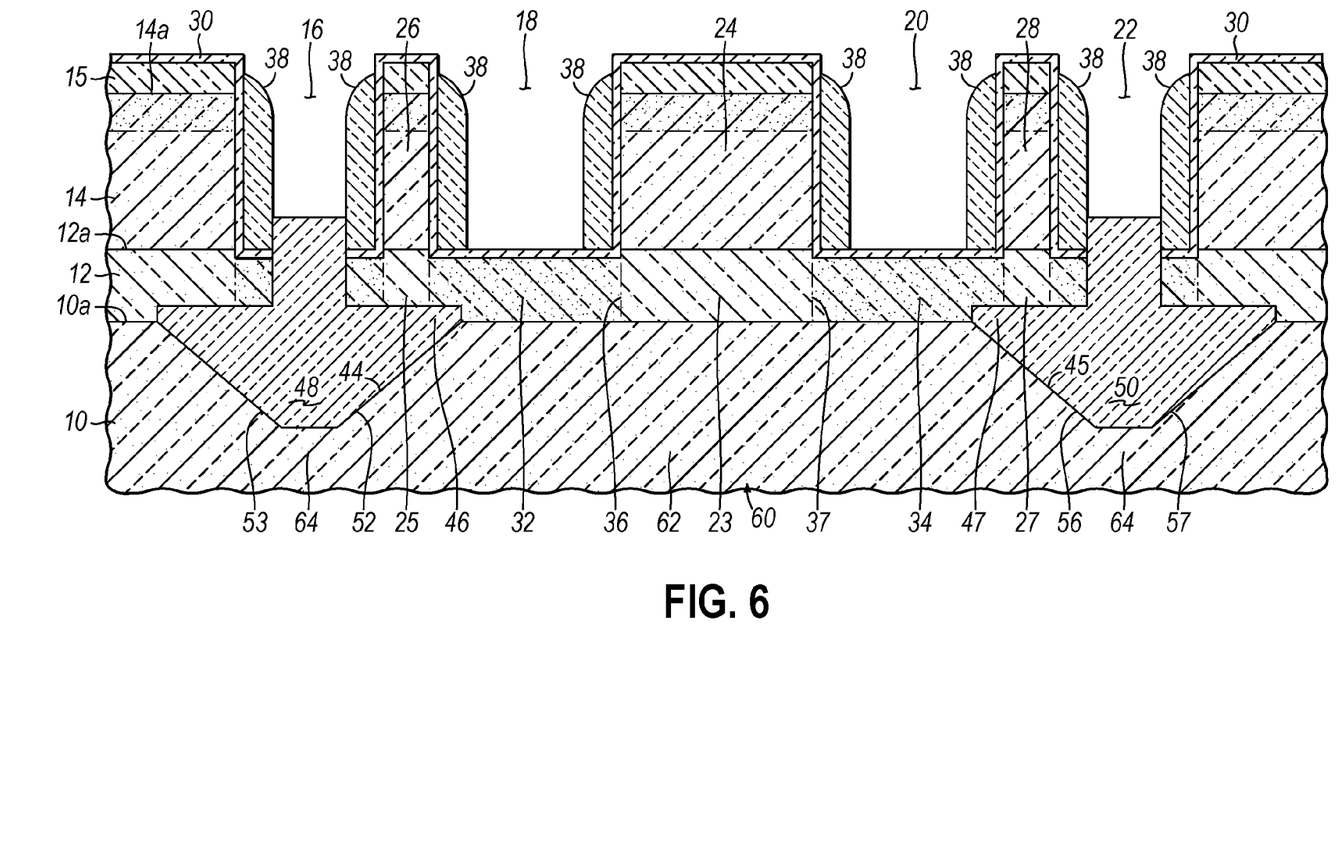

With reference to FIG. 6 in which like reference numerals refer to like features in FIG. 5 and at a subsequent fabrication stage of the processing method, trench isolation regions 48, 50 comprised of an electrical insulator are formed in the trenches 16, 22. The locations of the trench isolation regions 48, 50 in the substrate 10 are determined at least in part using the respective isolation pedestals 26, 28 as positional references. The locations at which the trenches 16, 22 are extended into the substrate 10, and thus defining the locations of the trench isolation regions 48, 50, are determined at least in part by the positions of the isolation pedestals 26, 28 when the mask layer 40 is applied and patterned.

The respective trench isolation regions 48, 50 in the substrate 10 reproduce the geometrical shape of the trenches 16, 22 and are nominally identical to each other. Trench isolation region 48 is characterized by sidewalls 52, 53 that are inclined at an angle relative to the top surface 10a of the substrate 10 as constrained by the geometrical shape of trench 16. Sidewalls 52, 53 are coextensive with the sidewalls of trench 16 in the substrate 10 and sidewall 52 extends laterally beneath the base layer 12 and the isolation pedestal 26. Trench isolation region 50 is characterized by sidewalls 56, 57 that are inclined at an angle relative to the top surface 10a of the substrate 10 as constrained by the geometrical shape of trench 22. Sidewalls 56, 57 are coextensive with the sidewalls of trench 22 in the substrate 10 and sidewall 56 extends laterally beneath the base layer 12 and the isolation pedestal 28.

Trench isolation regions 48, 50 may be connected and extend about the perimeter of the emitter 24 and an active device region, which is generally indicated by reference numeral 60, in the substrate 10. The active device region 60 contains a collector 62 comprising doped semiconductor material of substrate 10 and a sub-collector 64 that extends laterally beneath the trench isolation regions 48, 50. The sub-collector 64, which comprises doped semiconductor material of substrate 10, extends laterally beneath the trench isolation regions 48, 50 for coupling the collector 62 with an external contact in the MEOL wiring.

To form the trench isolation regions, a dielectric layer is deposited that fills the trenches 16, 22 with respective portions of the electrical insulator comprising the trench isolation regions 48, 50. The dielectric layer also deposits on the dielectric layer 30 and spacers 38. The dielectric layer may comprise any suitable organic or inorganic dielectric material, which may be an electrical insulator characterized by an electrical resistivity at room temperature of greater than $10^{10}$ (Ω-m). Candidate inorganic dielectric materials for dielectric layer may include, but are not limited to, silicon dioxide ($SiO_2$), fluorine-doped silicon glass (FSG), and combinations of these dielectric materials. Alternatively, the dielectric layer may comprise a low-k dielectric material characterized by a relative permittivity or dielectric constant smaller than the $SiO_2$ dielectric constant of approximately 3.9. Candidate low-k dielectric materials for dielectric layer include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (SiCOH), and carbon-doped oxides, and combinations of these and other organic and inorganic dielectrics. Dielectric layer may be deposited by any number of techniques including, but not limited to, sputtering, spin-on application, or CVD.

The dielectric layer is removed from trenches 18, 20, emitter 24, the isolation pedestals 26, 28, and field regions, but not from within the trenches 16, 22, by a wet etching process or a dry etching process. If the dielectric layer is comprised of an oxide of silicon, then an end-pointed RIE or an end-pointed oxide etch, such as buffered hydrofluoric acid or diluted hydrofluoric acid, may be employed to remove the dielectric layer from the field regions. Dielectric layer 30 may also be removed by this etching process.

In one specific embodiment, the dielectric layer used to form the trench isolation regions 48, 50 may be comprised of an oxide of silicon (e.g., $SiO_2$) deposited by low pressure chemical vapor phase deposition (LPCVD) using a silicon source of either silane or a mixture of silane with nitrogen. For example, the substrate temperature during LPCVD may range from 600° C. to 650° C. and the process chamber pressure during LPCVD may be range from 25 Pa to 150 Pa.

Figure 7:
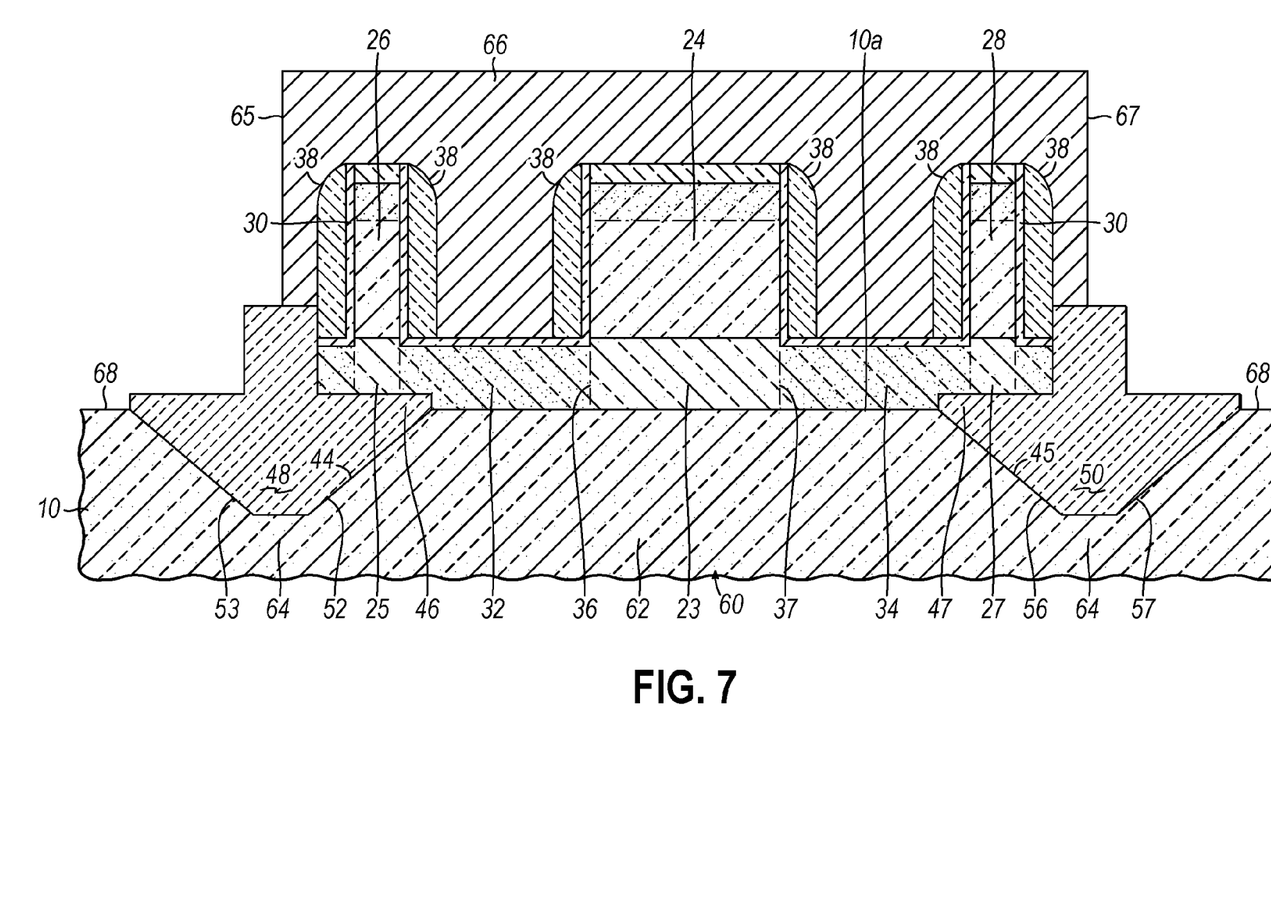

With reference to FIG. 7 in which like reference numerals refer to like features in FIG. 6 and at a subsequent fabrication stage of the processing method, a mask layer 66 is formed and patterned with a photolithography process, and then an etching process is used to define a contact area 68 to the sub-collector 64 and collector 62, as well as the footprint on the substrate for the bipolar junction transistor 70. The trench isolation regions 48, 50 formed using the isolation pedestals 26, 28 serve as positional references for the formation of the contact area 68 and, thereby, maintain the self-alignment between the collector 62, the emitter 24, and the base layer 12.

The mask layer 66 may comprise a photoresist that is applied by a spin coating process, pre-baked, exposed to a radiation projected through a photomask, baked after exposure, and developed with a chemical developer to form an etch mask that includes an island coinciding with the location of the bipolar junction transistor. Side edges 65, 67 of the island of mask layer 66, which are defined after the lithographical patterning, are aligned the trench isolation regions 48, 50 so that the mask layer 66 overlaps the trench isolation regions 48, 50. The etching process may comprise a wet etching process or a dry etching process, which may be conducted in a single etching step or multiple steps and which may rely on one or more etch chemistries. The mask layer 66 is removed after the conclusion of the etching process. If comprised of a photoresist, the mask layer 66 may then be removed by ashing or solvent stripping, followed by a conventional cleaning process.

With reference to FIG. 8 in which like reference numerals refer to like features in FIG. 7 and at a subsequent fabrication stage of the processing method, the device structure for the bipolar junction transistor 70 has a vertical architecture in which an intrinsic base 74 is located vertically between the emitter 24 and the collector 62. Collector 62 of the bipolar junction transistor 70 is defined beneath the top surface 10a of the substrate 10. The central section 23 of base layer 12 defines the intrinsic base 74, which is coextensive with the collector 62 along a junction 77. The emitter 24 and the central section 23 of intrinsic base 74 are coextensive along a junction 78. The doped regions 32, 34, which surround the intrinsic base 74, define an extrinsic base 76 in the device structure for the bipolar junction transistor 70. The extrinsic base 76 is directly coupled with the intrinsic base 74 along a boundary established by the interfaces 36, 37, which boundaries defines an outer or peripheral edge of the intrinsic base 74 and an inner edge of the extrinsic base 76. The bipolar junction transistor 70 may be characterized as a heterojunction bipolar transistor (HBT) if two or all three of the emitter 24, the collector 62, and the intrinsic base 74 are comprised of different semiconductor materials.

Standard silicidation, middle-end-of-line (MEOL), and back-end-of-line (BEOL) processing follows, which includes formation of contacts and wiring for the local interconnect structure, and formation of dielectric layers, via plugs, and wiring for an interconnect structure coupled by the interconnect wiring with a bipolar junction transistor 70, as well as other similar contacts for additional device structures like bipolar junction transistor 70 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

In particular, a silicide layer 81 is formed on the emitter 24, the contact area 68, and the extrinsic base 76. The silicide layer 81 on the contact area 68 may be contacted by contacts 80, 82. Contact 80, 82 are coupled by the sub-collector 64 with the collector 62. The silicide layer 81 on the extrinsic base 76 may be contacted by contacts 84, 86. Contact 84, 86 are coupled by the extrinsic base 76 with the intrinsic base 74. The silicide layer 81 on the emitter 24 may be contacted by a contact 88. The contacts 80, 82, 84, 86, 88 are disposed in a dielectric layer (not shown) of the BEOL interconnect structure.

In an alternative embodiment, the arrangement of device regions may be inverted such that the emitter 24 operates as the collector of the bipolar junction transistor 70 and the collector 62 operates as the emitter of the bipolar junction transistor 70 with the intrinsic base 74 sandwiched therebetween. In this alternative configuration, any need to contact the collector with a through-silicon via (TSV) may be avoided.

During the front-end-of-line (FEOL) portion of the fabrication process, the device structure of the bipolar junction transistor 70 is replicated across at least a portion of the surface area of the substrate 10. In BiCMOS integrated circuits, complementary metal-oxide-semiconductor (CMOS) transistors (not shown) may be formed using other regions of the substrate 10. As a result, both bipolar and CMOS transistors may be available on the same substrate 10.

The emitter 24, intrinsic base 74, and collector 62 are self-aligned for high performance and are formed by a series of photolithography and etch events in the different stages of the process flow. The self-alignment is done without the use of spacers as reference structures, but instead relies on isolation pedestals 26, 28. In connection with FIG. 2 of the process flow, the trenches 16, 18, 20, 22 are simultaneously formed using a lithographically-defined mask layer 17 (FIG. 1) and etch. Trenches 18, 20 define the emitter 24, trenches 16, 18 define isolation pedestal 26, and trenches 20, 22 define isolation pedestal 28. In connection with FIG. 3 of the process flow, the spacer-narrowed trenches 16, 22 are simultaneously extended into the substrate using a different lithographically-defined mask layer 40 and etch, while the emitter 24 is protected and the trenches 18, 20 are not extended. The isolation pedestals 26, 28 maintain the self-alignment of the emitter 24 and intrinsic base 74. In connection with FIG. 7 of the process flow, a different lithographically-defined mask and etch is used to define the contact area 68. The isolation pedestals 26, 28 operate in conjunction with the mask to maintain the self-alignment of the emitter 24 and intrinsic base 74.

The dimensions of the extrinsic base are controlled by the width of the trenches 18, 20 and are thus independent of the width of the emitter 24. The width of the emitter 24 may be selected based upon the separation between trench 18, and trench 20, which may permit large emitter widths for use of the bipolar junction transistor 70 in high power applications (e.g., power amplifiers). In addition, the extrinsic base 76 of the bipolar junction transistor 70 is not positioned on the top surface of the intrinsic base 74 and, hence, is not raised.

Figure 9:
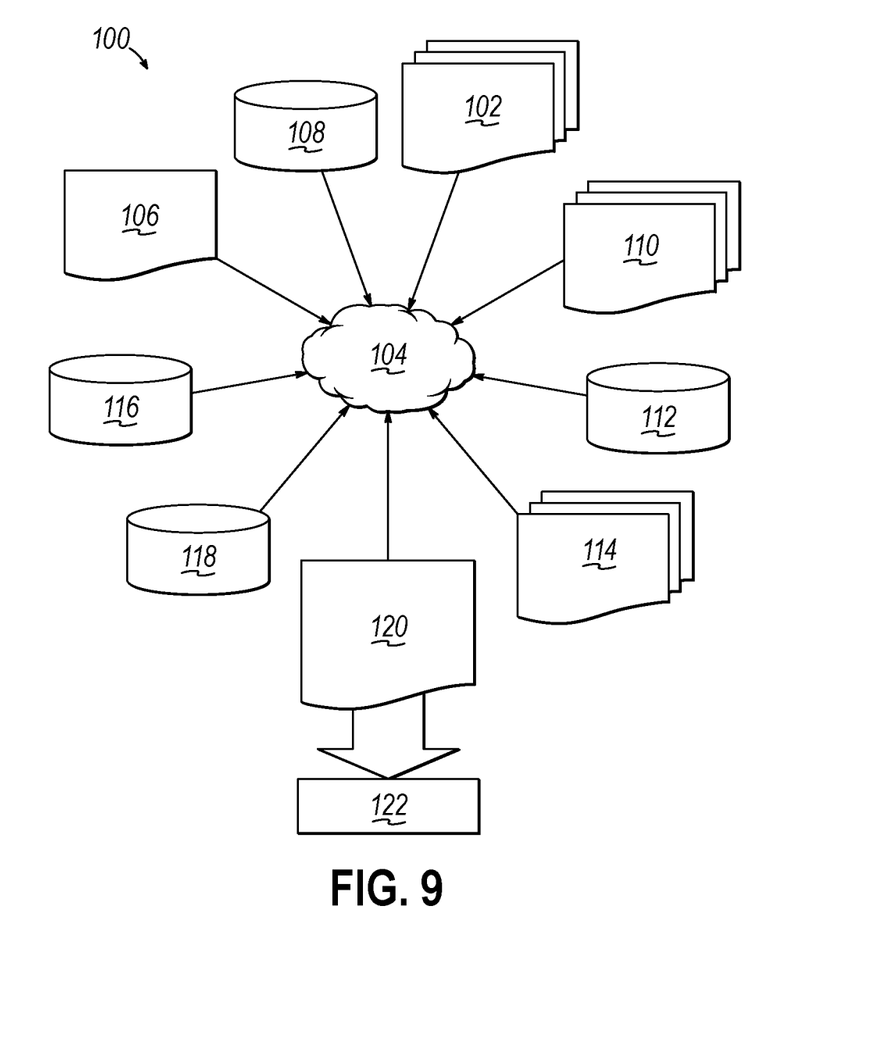
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 7 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 8. In one embodiment, design structure 120 may comprise a compiled, executable HDL simulation model that functionally simulates the devices shown in FIG. 8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor formed using a substrate, the device structure comprising:
   an intrinsic base on the substrate;
   a first terminal on the intrinsic base, the first terminal vertically separated from the substrate by the intrinsic base, and the first terminal comprised of a first section of a layer of a first semiconductor material; and
   a first isolation pedestal comprised of a second section of the layer of the first semiconductor material, the first isolation pedestal spaced laterally from the first terminal by a trench in the layer of the first semiconductor material.

2. The device structure of claim 1 wherein the first terminal is an emitter of the bipolar junction transistor.

3. The device structure of claim 1 wherein the first isolation pedestal is narrower in width than the emitter.

4. The device structure of claim 1 further comprising:
an extrinsic base on the substrate, the extrinsic base and the intrinsic base comprised of respective first and second sections of a layer of a second semiconductor material, and the first section of the layer of the second semiconductor material has a higher electrical conductivity than the second section of the layer of the second semiconductor material.

5. The device structure of claim 4 wherein the extrinsic base is laterally positioned between the first terminal and the first isolation pedestal.

6. The device structure of claim 1 wherein the first isolation pedestal has a first layer thickness and the first terminal has a second layer thickness equal to the first layer thickness.

7. The device structure of claim 1 further comprising:
a first trench isolation region comprised of a dielectric material and having a position in the substrate determined at least in part by the first isolation pedestal.

8. The device structure of claim 7 further comprising:
a second terminal beneath a top surface of the substrate; and
a contact area coupled with the second terminal,
wherein the first trench isolation region is laterally positioned between the first isolation pedestal and the contact area.

9. The device structure of claim 1 wherein the first terminal and the intrinsic base are coextensive along a first junction, and further comprising:
a second terminal beneath a top surface of the substrate, the second terminal being coextensive with the intrinsic base along a second junction.

10. The device structure of claim 1 further comprising:
a second isolation pedestal comprised of a third section of the layer of the first semiconductor material,
wherein the first terminal is laterally positioned between the first isolation pedestal and the second isolation pedestal.

11. The device structure of claim 10 wherein the first isolation pedestal and the second isolation pedestal are symmetrically positioned about the first terminal.

12. The device structure of claim 10 further comprising:
a first trench isolation region comprised of a dielectric material and having a position in the substrate determined at least in part by the first isolation pedestal; and
a second trench isolation region comprised of the dielectric material and having a position in the substrate determined at least in part by the second isolation pedestal.

13. The device structure of claim 12 wherein the first trench isolation region and the second trench isolation region are connected and extend about the perimeter of the first terminal.

14. The device structure of claim 12 wherein the dielectric material is an oxide of silicon.

15. The device structure of claim 1 wherein the first terminal is a collector of the bipolar junction transistor.

16. A hardware description language (HDL) design structure encoded on a machine-readable data storage medium, the HDL design structure comprising elements that when processed in a computer-aided design system generates a machine-executable representation of a bipolar junction transistor, the HDL design structure comprising:
an intrinsic base on a substrate;
a first terminal on the intrinsic base, the first terminal vertically separated from the substrate by the intrinsic base, and the first terminal comprised of a first section of a layer of a semiconductor material; and
a first isolation pedestal comprised of a second section of the layer of the semiconductor material, the first isolation pedestal spaced laterally from the first terminal by a trench in the layer of the semiconductor material.

17. The HDL design structure of claim 16 wherein the HDL design structure comprises a netlist.

18. The HDL design structure of claim 16 wherein the HDL design structure resides on storage medium as a data format used for the exchange of layout data of integrated circuits.

19. The HDL design structure of claim 16 wherein the HDL design structure resides in a programmable gate array.

\* \* \* \* \*